United States Patent [19]

Mikoshiba et al.

[11] Patent Number: 5,476,547
[45] Date of Patent: Dec. 19, 1995

[54] GAS FEEDING DEVICE FOR CONTROLLED VAPORIZATION OF AN ORGANOMETALLIC COMPOUND USED IN DEPOSITION FILM FORMATION

[75] Inventors: Nobuo Mikoshiba; Kazuo Tsubouchi; Kazuya Masu, all of Sendai, Japan

[73] Assignee: Canon Kabushiki Kaisha, Tokyo, Japan

[21] Appl. No.: 232,431

[22] Filed: Apr. 21, 1994

Related U.S. Application Data

[63] Continuation of Ser. No. 41,340, Apr. 1, 1993, abandoned, which is a continuation of Ser. No. 869,121, Apr. 15, 1992, abandoned, which is a continuation of Ser. No. 586,877, Sep. 24, 1990, abandoned.

[30] Foreign Application Priority Data

| Sep. 26, 1989 | [JP] | Japan | 1-250025 |
| Sep. 26, 1989 | [JP] | Japan | 1-250026 |
| Sep. 26, 1989 | [JP] | Japan | 1-250027 |

[51] Int. Cl.⁶ .................................................. C23C 16/52
[52] U.S. Cl. ................................... 118/726; 261/124
[58] Field of Search .......................... 118/715, 726; 427/248.1; 261/124, DIG. 65

[56] References Cited

U.S. PATENT DOCUMENTS

| 3,361,781 | 1/1968 | Ziegler et al. | 261/124 |
| 4,134,514 | 1/1979 | Schumacher et al. | 261/124 |
| 4,436,674 | 3/1984 | McMenamin | 118/726 |
| 4,506,815 | 3/1985 | Melas et al. | 222/630 |
| 4,517,220 | 5/1985 | Rose | 118/715 |
| 4,545,801 | 10/1985 | Migajiri et al. | 118/715 |
| 4,761,269 | 8/1988 | Conger et al. | 118/715 |
| 4,783,343 | 11/1988 | Sato | 118/726 |
| 4,904,419 | 2/1990 | Reynolds | 261/121.1 |
| 4,911,101 | 3/1990 | Ballingall, III et al. | 118/715 |
| 4,919,304 | 4/1990 | Markowicz | 222/630 |
| 5,070,814 | 12/1991 | Whiffin et al. | 118/715 |

FOREIGN PATENT DOCUMENTS

| 0139134 | 5/1985 | European Pat. Off. . | |
| 0283874 | 9/1988 | Germany . | |
| 60-131973 | 7/1985 | Japan . | |
| 60-131968 | 7/1985 | Japan | 118/715 |
| 60-154627 | 8/1985 | Japan | 118/715 |
| 61-24227 | 2/1986 | Japan | 118/726 |
| 61-187229 | 8/1986 | Japan | 118/715 |
| 62-33769 | 2/1987 | Japan . | |

(List continued on next page.)

OTHER PUBLICATIONS

R. A. Levy et al., "Characterization of LPCVD Aluminum for VLSI Processing", Journal of the Electrochemical Society, vol. 131, No. 9, pp. 2175–2182, Sep. 1984.

R. Bhat et al., "The Growth and Characterization of AlGaAs Using Dimethyl Aluminum Hydride", Journal of Crystal Growth, vol. 77, pp. 7–10 (1986) no month available.

M. Hanabusa et al., "Photochemical Vapor Deposition of Aluminum Thin Films Using Dimethylaluminum Hydride", Japanese Journal of Applied Physics, vol. 27, No. 8, pp. L1392–L1394, Aug. 1988.

A. Sekiguchi et al., "Gas–Temperature–Controlled (GTC) CVD of Aluminum and Aluminum–Silicon Alloy Film for VLSI Processing", Japanese Journal of Applied Physics, vol. 27, No. 11, pp. L2134–L2136, Nov. 1988.

*Primary Examiner*—Terry J. Owens
*Attorney, Agent, or Firm*—Fitzpatrick, Cella, Harper & Scinto

[57] ABSTRACT

A gas feeding device for feeding to a reaction vessel a starting gas for film formation by chemical vapor deposition. The gas feeding device is connected to a container which contains an organometallic compound, and has a plurality of gas introducing openings for introducing a carrier gas into the container for carrying vaporized organometallic compound into the reaction vessel. The gas feeding device includes an accelerating device which selects a carrier gas introducing route into the container through at least one of the plurality of gas introducing openings for accelerating the generation of the starting gas.

8 Claims, 7 Drawing Sheets

FOREIGN PATENT DOCUMENTS

| | | | |
|---|---|---|---|
| 62-83400 | 4/1987 | Japan | 118/715 |
| 62-207870 | 9/1987 | Japan . | |
| 62-229822 | 10/1987 | Japan | 156/610 |
| 63-18076 | 1/1988 | Japan | 118/726 |
| 63-33569 | 2/1988 | Japan . | |
| 3-122117 | 5/1988 | Japan | 118/715 |
| 63-107111 | 5/1988 | Japan | 118/715 |
| 63-314826 | 12/1988 | Japan | 118/715 |
| 64-84620 | 3/1989 | Japan | 118/715 |
| 1-252776 | 10/1989 | Japan . | |
| 2-170419 | 7/1990 | Japan . | |
| 2-185026 | 7/1990 | Japan . | |
| WO8907667 | 8/1989 | WIPO . | |

GAS FEEDING DEVICE FOR CONTROLLED VAPORIZATION OF AN ORGANOMETALLIC COMPOUND USED IN DEPOSITION FILM FORMATION

This application is a continuation of application Ser. No. 08/041,340, filed Apr. 1, 1993, now abandoned, which is a continuation of application Ser. No. 07/869,121, filed Apr. 15, 1992, now abandoned, which is a continuation of application Ser. No. 07/586,877, filed Sep. 24, 1990, which is now abandoned.

BACKGROUND OF THE INVENTION

1. Field of the Invention

The present invention relates to a deposition-film-forming apparatus and a gas feeding device. In particular, the present invention relates to a gas-feeding device which is suitable for feeding an organometallic compound-containing starting gas or the like in a thin-film deposition apparatus by the chemical vapor deposition (CVD) method.

2. Related Background Art

A chemical vapor deposition method using an organometallic compound is employed widely for the deposition of a metal thin-film or a semiconductor thin-film of III–V groups. The widely used organometallic starting materials, trimethylgallium (TMG) and trimethylaluminum (TMA), are liquid at room temperature. By the flow of a carrier gas like argon, which is introduced through a tube inserted into the liquid organometallic compound, the liquid organometallic compound is transported in a vapor state to a reaction vessel constituting a space for forming the deposited film.

FIG. 7 illustrates a conventional gas feeding device for transporting a gas (a starting gas) containing an organometallic compound. An organometallic compound 2 is stored in a liquid state in a metallic container 1. A carrier gas 6, such as argon, is blown as bubbles into the liquid through a metal pipe 41 which is inserted into the organometallic compound, 2. The organometallic compound brought into the bubbles in a saturated vapor state, is transported as the starting gas 7 to a reaction vessel (not shown) through a pipe 42 which is not inserted into the liquid. For example, with an inserted pipe 41, having a diameter of ¼ inch and having a carrier gas flow rate of from 1 to 100 sccm, an organometallic compound such as TMG and TMA can be transported in an amount corresponding to the saturated vapor pressure in the carrier gas that is outgoing from the outlet pipe 42.

However, for improving productivity, namely for constituting a deposition-film-forming apparatus which is capable of depositing a thin film on a plurality of substrates at the same time, a large amount of starting gas is correspondingly required. If a large flow rate of the carrier gas, as much as from 1 to 10 l/min, is introduced through one metal pipe 41, as shown in FIG. 7, the organometallic compound will not be saturated sufficiently in the bubbles, so that the quantity of the transported organometallic compound will not increase even if the flow rate of the carrier gas is increased. In particular, for a viscous organometallic compound, the bubbles formed by the metal pipe 41 becomes large in size, causing a pulsation of a discharged gas flow, or in an extreme case, the bubbles may come to join together to form a tubular gas flow path which reaches to the gas layer above the liquid surface. For example, with a metal pipe 41 having ¼ inch diameter, the carrier gas flow path may change at a flow rate of around 100 cc/min from a bubble form to a tubular form, resulting in a disproportionality between the of the amount of the transported organometallic compound and the flow rate of the carrier gas.

Accordingly, for transportation in a high flow rate, use of a plurality of containers for containing the organometallic compound may be considered. For example, for a required flow rate of the carrier gas of from 1 to 10 l/min, 10 to 100 containers are required on the assumption that 100 cc/min of the carrier gas can be introduced per container. In such a case, problems may be involved because of a size increase in the apparatus, a rise in the cost, and complications in maintenance.

On the other hand, Japanese Patent Laid-open Application No. sho-62-33769 discloses the perforation of a number of holes at the tip of the metal tube. This may be effective for an organometallic compound having a low viscosity such as TMG, but cannot always be effective for an organometallic compound having a high viscosity.

Japanese Patent Laid-open Application No. sho-62-207870 discloses the installation of an ultrasonic wave generator having a magnetostrictive oscillator coupled onto an organic metallic compound containing container. In an example thereof, a metal pipe for introducing a carrier gas is inserted into the compound in a gas phase. However, the generation of mist by the ultrasonic effect cannot be expected because the container generally contains little of the gas which causes cavitation. Although a description is found in the patent publication that the metal pipe for the carrier . introduction may be inserted into the organometallic compound, a sufficient cavitation effect cannot be expected in viscous organometallic compounds because bubbles are not readily generated when the carrier gas has a high flow rate, as mentioned above.

Further, for the case of organometallic compounds having a low viscosity like TMG, the above-cited Japanese Patent Laid-open Application No. sho- 62-207870 shows a method for transporting TMG effectively at a high flow Pate. This method, however, is not so effective for organometallic compounds like DMAH (dimethyl aluminum hydride) having a high viscosity. This is because no measure is taken during the introduction of a carrier gas for the formation of minute bubbles in the organometallic compound.

Japanese Patent Laid-open Application No. sho-60-131973 discloses a method for vaporizing a liquid organometallic compound by bubbling the gas in such a manner that the gas is ejected through a bubble-forming device having a plurality of gas-ejecting holes at the tip of the gas ejection portion. Even with this method, however, there may be some instability during the feeding of the gaseous organometallic compound for the vaporization of a large amount of the organometallic compound for rapid formation of a deposition film because bubbles which are caused by the introduction of a large amount of gas, combine mutually to form even larger bubbles that splash out of the liquid organometallic compound the splashing being caused by the bursting of the larger bubbles, and the resulting accumulation of the liquid in a feed pipe.

As discussed above, there has been no satisfactory gas feeding device for feeding a large amount of a starting gas employing an organometallic compound having a high viscosity.

SUMMARY OF THE INVENTION

An object of the present invention is to provide a gas feeding device and a deposition-film-forming apparatus which do not involve the disadvantage of a size increase of the apparatus and are capable of transporting a large amount of starting gas even with viscous organometallic compounds.

Another object of the present invention is to provide a gas-feeding device and a deposition-film-forming apparatus which is capable of transporting a large quantity of an alkylaluminum hydride in high purity which is suitable for satisfactorily conducting a good deposition film formation.

According to an aspect of the present invention, there is provided a gas-feeding device for feeding a starting gas for deposition-film-formation by the chemical vapor deposition method, comprising a container, having a space for discharging the starting gas, containing an organometallic compound by introduction of a carrier gas; a gas-introducing means connected to the container and having a plurality of gas-introducing openings for introducing the carrier gas or the starting gas into the container to generate the starting gas; and a gas generation-accelerating means for accelerating the generation of the starting gas.

According to another aspect of the present invention, there is provided a gas feeding device for feeding a starting gas for deposition-film-formation by the chemical vapor deposition method comprising an organometallic compound-storing means for discharging the starting gas containing the organometallic compound by introduction of a carrier gas; a plurality of gas-introducing members for introducing the carrier gas into the storing means; and a gas switching means for turning on or turning off feed lines of the carrier gas connected to the plurality of gas-introducing members, and for distributing the carrier gas through the turned-on feed line.

According to still another aspect of the present invention, there is provided a gas-feeding device for feeding a starting gas for deposition-film-formation by the chemical vapor deposition method comprising an organometallic compound-storing means for discharging the starting gas containing the organometallic compound by introduction of a carrier gas; a gas-introducing member having a plurality of small openings for introducing the carrier gas into the storing means; and an ultrasonic oscillator arranged in the storing means.

According to a further aspect of the present invention, there is provided a gas-feeding device for feeding a starting gas for deposition-film-formation by the chemical vapor deposition method comprising a container, having a space for discharging the starting gas, containing an organometallic compound by introduction of a carrier gas; and an injection means for injecting the organometallic compound in a mist state into the container.

According to a still further aspect of the present invention, there is provided a deposition-film-forming apparatus for the chemical vapor deposition method comprising:

(1) a gas-feeding device comprising a container, having a space for introducing and discharging a starting gas, containing an organometallic compound for formation of deposition film by aid of a carrier gas; a gas-introducing means connected to the container and having a plurality of gas-introducing openings for introducing the the carrier gas or the starting gas into the container to generate the starting gas; and a gas generation-accelerating means for accelerating the generation of the starting gas;

(2) a reaction chamber connected to the gas-feeding device to receive the starting gas fed therein, and (3) an exhausting means connected to the reaction chamber for exhausting the reaction chamber.

According to a still further aspect of the present invention, there is provided a deposition-film-forming apparatus for the chemical vapor deposition method comprising:

(1) a gas feeding device comprising an organometallic compound-storing means for discharging the starting gas containing the organometallic compound by introduction of a carrier gas for deposition film formation; a plurality of gas-introducing members for introducing the carrier gas into the storing means; and a gas switching means for turning on or turning off feed lines of the carrier gas to the plurality of gas-introducing means, and distributing the carrier gas through the opened feed line, (2) a reaction chamber connected to the gas-feeding device to receive the starting gas fed therein, and (3) an exhausting means connected to the reaction chamber for exhausting the reaction chamber.

According to a still further aspect of the present invention, there is provided a deposition-film-forming apparatus for the chemical vapor deposition method comprising:

(1) a gas feeding device comprising an organometallic compound-storing means for discharging the starting gas containing the organometallic compound by introduction of a carrier gas for deposition film formation; a gas-introducing member having a plurality of openings for introducing the carrier gas into the storing means; and a ultrasonic oscillator installed in the storing means, (2) a reaction chamber connected to the gas-feeding device to receive the starting gas fed therein, and (3) an exhausting means connected to the reaction chamber for exhausting the reaction chamber.

According to a still further aspect of the present invention, there is provided a deposition-film-forming apparatus for the chemical vapor deposition method comprising:

(1) a gas feeding device comprising a container having a space for discharging the starting gas containing an organometallic compound by introduction of a carrier gas for deposition film formation; and an injection means fop injecting the organometallic compound in a mist state into the container, (2) a reaction chamber connected to the gas-feeding device to receive the starting gas fed therein, and (3) an exhausting means connected to the reaction chamber for exhausting the reaction chamber.

DETAILED DESCRIPTION OF THE PREFERRED EMBODIMENT

Preferable gas-feeding devices of the present invention are as described below.

The gas-feeding device of the present invention comprises a container, having a space for discharging the starting gas, containing an organometallic compound by introduction of a carrier gas; a gas-introducing means connected to the container and having a plurality of gas-inlets for introducing the the carrier gas or the starting gas into the container to generate the starting gas; and a gas generation-accelerating means for accelerating the generation of the starting gas.

The gas-feeding device of the present invention is capable of feeding a large quantity of a starting gas stably by employing a plurality of the gas-introducing openings and gas generation-accelerating means. The gas-feeding device of the present invention is capable of transporting a large quantity of starting gas even with a viscous organometallic compound without causing the problem of a disadvantageous size increase of the apparatus.

The deposition-film-forming apparatus of the present invention comprises the aforementioned gas-feeding device, a reaction chamber connected to the gas-feeding device to receive the starting gas fed therein, and a gas-exhausting means connected to the reaction chamber to exhaust the reaction chamber.

The deposition-film-forming apparatus comprising the gas-feeding device of the present invention is capable of stably feeding a large quantity of a starting gas into the reaction chamber, allowing the formation of a deposition film of high quality at a high deposition rate.

An example of the present invention is described in detail by referring to the figures.

As described later, dimethyl aluminum hydride (DMAH) gives a deposit of Al or an Al—Si alloy of high quality merely by a thermal reaction on a surface of an electron-donating material by using hydrogen as a reaction gas. The vapor pressure of the DMAH is approximately 1 Torr at room temperature, so that it is readily transported in comparison with TIBA (vapor pressure: approximately 0.1 Torr at room temperature) which has been used as the starting material for Al in CVD.

In the case of a deposition-film-forming apparatus according to the vacuum CVD method, in mass production, the amount of the carrier gas used is required to be as large as 1 to 10 l/min. DMAH, which has a high viscosity, has a couple of problems. Either the transporting gas flow tends to become pulsated resulting in a hindrance of continuous transportation, or the gas flow becomes tubular as mentioned before.

Accordingly, this example has the constitution below.

Figure 1:
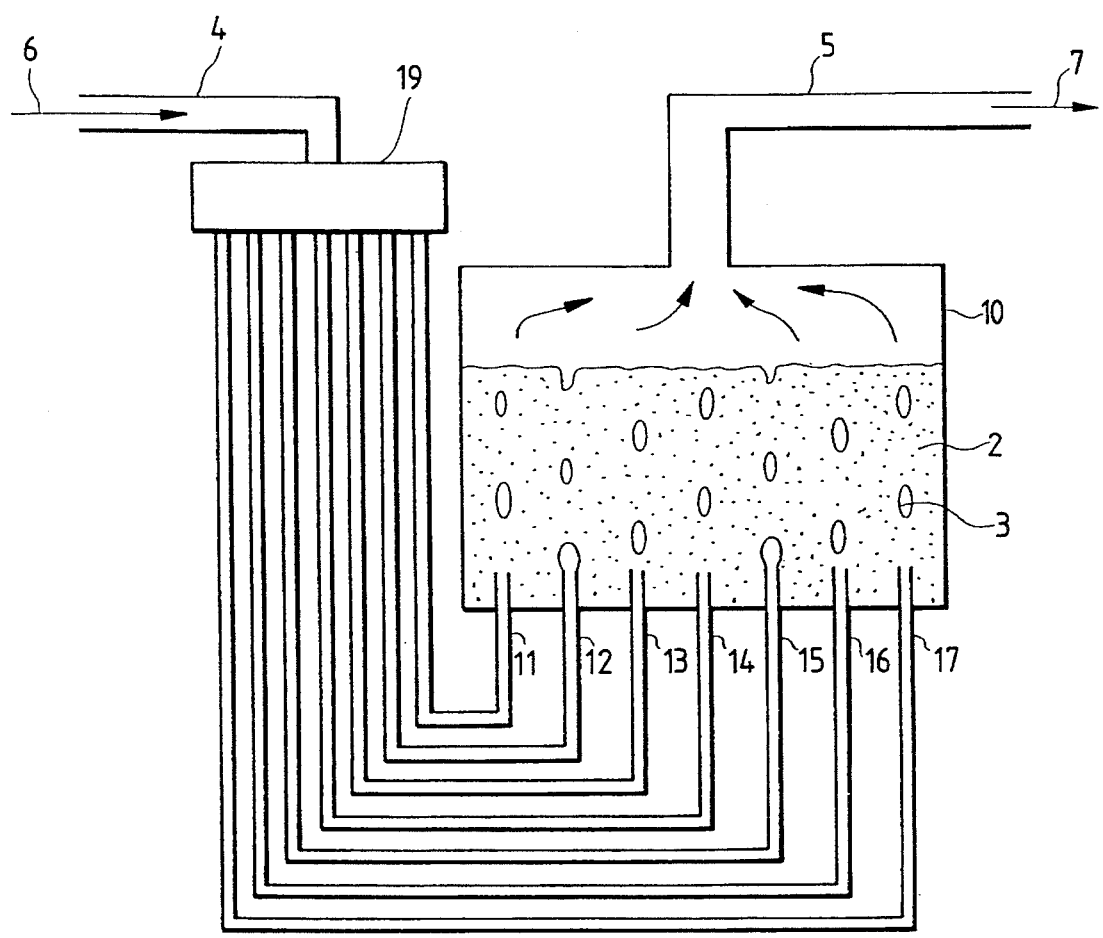
FIG. 1 is a schematic diagram illustrating an example of the gas-feeding device of the present invention.

FIG. 1 illustrates an example of the constitution of the gas-feeding device of the present invention.

The metallic container 10 is made of SUS. The inside surface of the metallic container is preferably coated with $SiO_2$ or the like because organometallic compounds such as DMAH and TMA will decompose at a metal surface in the presence of hydrogen even at room temperature to form an unnecessary alkane such as methane and the like. At the bottom of the container 10, a plurality of pipes are arranged in a horizontal direction at approximately equal distances with the gas discharging openings directed upwards. A carrier gas 6 is introduced from an inlet pipe 4 to form bubbles 3. The vapor of the organometallic compound 2 is transported along with the carrier gas through an outlet pipe 5 to a reaction vessel (see FIG. 6). A gas-switch 19 selects the gas introduction routes from pipes 11–17 inserted into the organometallic compound 2 to introduce the carrier gas fed from the inlet pipe 4 to pipes 11–17 in pulse with delays in timing. The gas-switch is constituted, for example, of valve bodies placed in connection with portions of the respective pipes such as electromagnetic valves operated by electric current; an effector for the valves; and a control means for the effector. Although seven pipes are shown in FIG. 1, the number of the pipes may be more or less than seven. The timing for switching is adjusted depending on the length of each pipe (11–17) from the gas switch 19 to the outlets. In this example, the gas-switch 19 serves as a gas-generation-accelerating means.

Figure 2:
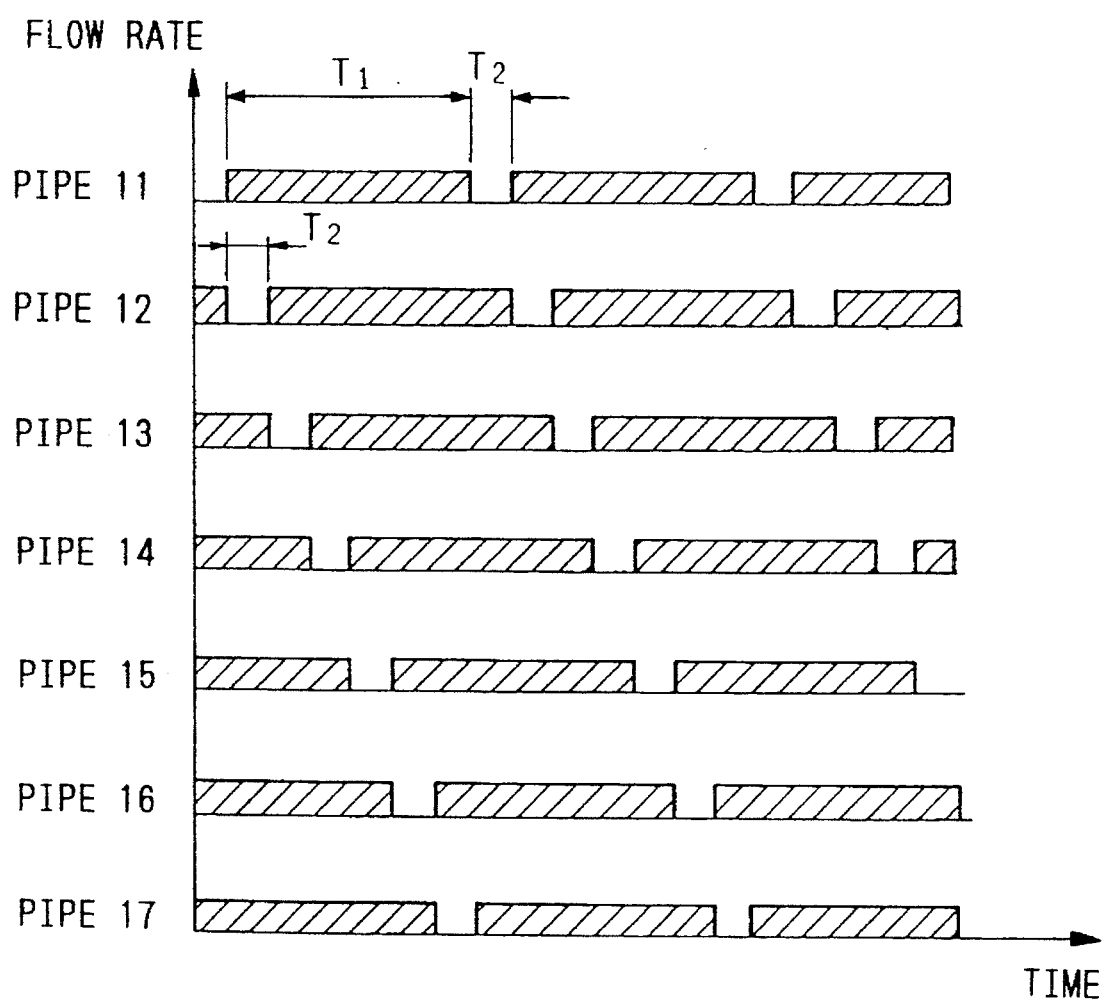
FIG. 2 is a timing chart for explaining a method for driving the device.

FIG. 2 shows a timing pattern for the introduction of the carrier gas to the pipes 11–17. In FIG. 2, the hatched portions show the time of flowing of the gas in the respective pipes. The flow rates in the respective pipes are adjusted to be equal at any time. In correspondence with the dimension of the pipes, the time $T_1$ and $T_2$ is determined so that the bubbles formed by the carrier gas in the organometallic compound may not communicate the outlets with the gas layer. In the timing chart of FIG. 2, the carrier gas flows through 6 pipes at any time as the simplest example, where the one sixth of the carrier gas introduced through the inlet pipe 4 is distributed to each of the six pipes of the pipes 11–17.

In the case where the pipes have respectively one opening, the quantity of the carrier gas introduced into the respective pipes 11–17 is preferably not more than 100 cc/min for DMAH. In a more preferable example, where plural small openings, not a single opening, are provided for each tip of the pipes 11–17, the carrier gas flow rate in each pipe may be larger than 100 cc/min. When small openings of n in number are provided in each pipe, then the carrier gas flow rate in each of the pipes is up to n×100 cc/min. Specifically, for each of the pipes 11–17 of ⅜ inch or ¼ inch in diameter, the number is more preferably not more than 10. If the number is larger, then there is a high probability that the formed bubbles may combine with each other. At any rate, a measure should be taken so that the bubbles ejected from the tip of the pipe may not join together to form a tubular gas phase communicating with the above gas layer.

In the device shown in FIG. 1, bubbles are formed sequentially from the respective pipes 11–17 nearly continuously as a whole without pulsation of the starting gas 7 discharged from outlet pipe 5.

By use of the gas-feeding device of the example, the size of bubbles from the respective openings can be made smaller by appropriate selection of the flow rate of the carrier gas introduced through the plural gas-introducing means and intermittent feed of the carrier gas to a respective gas-introducing member with a recess time of $T_2$, whereby the organometallic compound can be vaporized sufficiently into the gas, and a large quantity of the starting gas can be fed.

Figure 3:
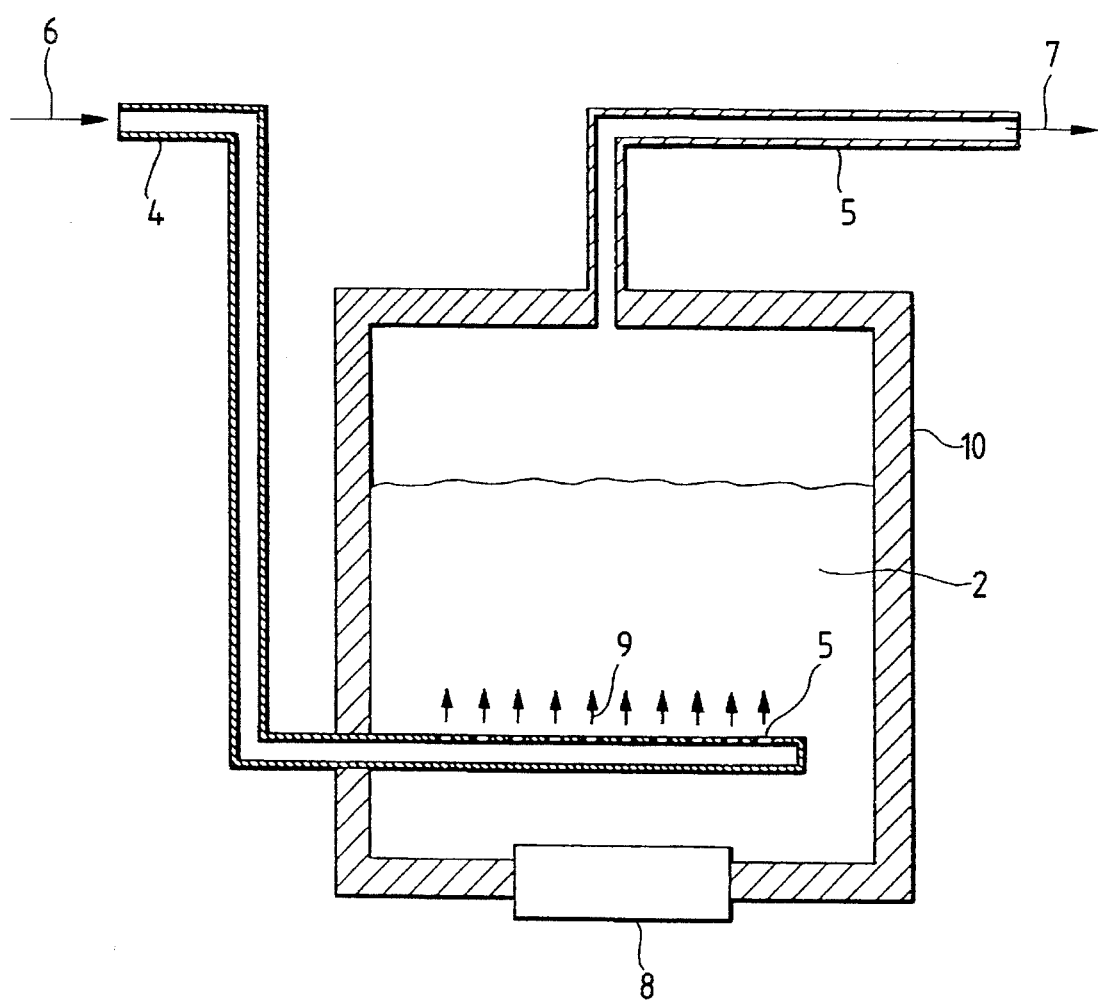
FIG. 3 is a schematic diagram illustrating another example of the gas-feeding device of the present invention.

FIG. 3 shows another example of the constitution of the gas-feeding device of the present invention.

The metallic container 10 is made of SUS. The inside surface of the metallic container is preferably coated with $SiO_2$ or the like because an organometallic compound such as DMAH, and TMA will decompose at a metal surface in the presence of hydrogen even at room temperature to form an unnecessary alkane such as methane and the like.

A plurality of a small openings 5 are provided for gas discharge on the metal pipe 4 inserted in a organometallic compound. A carrier gas is ejected through each of the small openings. The small openings may be provided either at a uniform interval or at irregular intervals. The pipe 4 inserted in the organometallic compound, although illustrated in linear form in FIG. 3, may be in a circular form or in a serpentine form so as to distribute the positions of the openings uniformly in the organometallic compound container 10.

In particular, if the organometallic compound 2 is DMAH having a high viscosity, the carrier gas flow rate through the respective small openings 5 is preferably not more than 100 sccm. A larger flow rate than 100 sccm may destroy the bubbles of the carrier gas ejected from the small openings, forming an open gaseous path from the small openings to the surface of the organometallic compound in a tubular form, which may retard the cavitation effect generated by a supersonic oscillator employed in this example.

The ultrasonic oscillation 8 produces a cavitation effect to generate fine bubbles, and effectively forms a mist of the organometallic compound from the surface of the organometallic compound. The ultrasonic oscillator may be provided in plurality irrespectively of the one ultrasonic oscillator 8 in FIG. 3. Moreover, the ultrasonic oscillator may be installed on a side face of the organometallic compound container 10. In this example, the ultrasonic oscillator 8 serves as a gas-generation-accelerating means for forming the starting gas effectively.

In this example, small openings are provided and a limited flow rate of carrier gas, ejected from each of the small openings realizes the generation of fine bubbles in the organometallic compound and the formation of mist on the liquid surface. However, the effective generation of fine bubbles cannot be achieved sufficiently by only providing the small openings. In particular, for a viscous organometallic compound like DMAH, it is desirable for the carrier gas to be ejected from the respective small openings continuously and at a flow rate lower than a certain level.

In this example, DMAH having a high viscosity can be transported by the carrier gas flowing out from the organometallic compound contained in the metallic container 10 containing an amount corresponding to the saturated vapor pressure of DMAH by limiting the flow rate of the carrier gas ejected from small openings 5 to approximately 100 sccm and employing a cavitation effect of ultrasonic oscillation, even when the total carrier gas introduced to the metallic container 10 is in an amount as large as 10 slm (standard liter per minute).

No method has hitherto been found for effectively transporting an organometallic compound by such a large amount of a carrier gas. In particular, in the vacuum CVD method, the number of wafers used in one deposition batch depends on the efficiency of the transportation of a large amount of viscous DMAH. The use of the gas-feeding device of the present invention in a deposition-film-forming apparatus shown later in FIG. 6 makes feasible the deposition of an Al or Al—Si thin film on 100–200 wafers of 4 inches in one deposition batch at a high deposition rate.

In the gas-feeding device shown in the present example, a mist of an organometallic compound is generated by a great number of fine bubbles or by a gas phase in the organometallic compound-storing means by selecting appropriately the carrier gas flow rate for each small opening (e.g., approximately 100 sccm or less), and further by causing cavitation by an ultrasonic oscillator installed in the metallic container containing the organometallic compound, thereby the organometallic compound can be contained in the carrier gas ejected from the container in an amount corresponding to the saturated vapor pressure.

Figure 4:
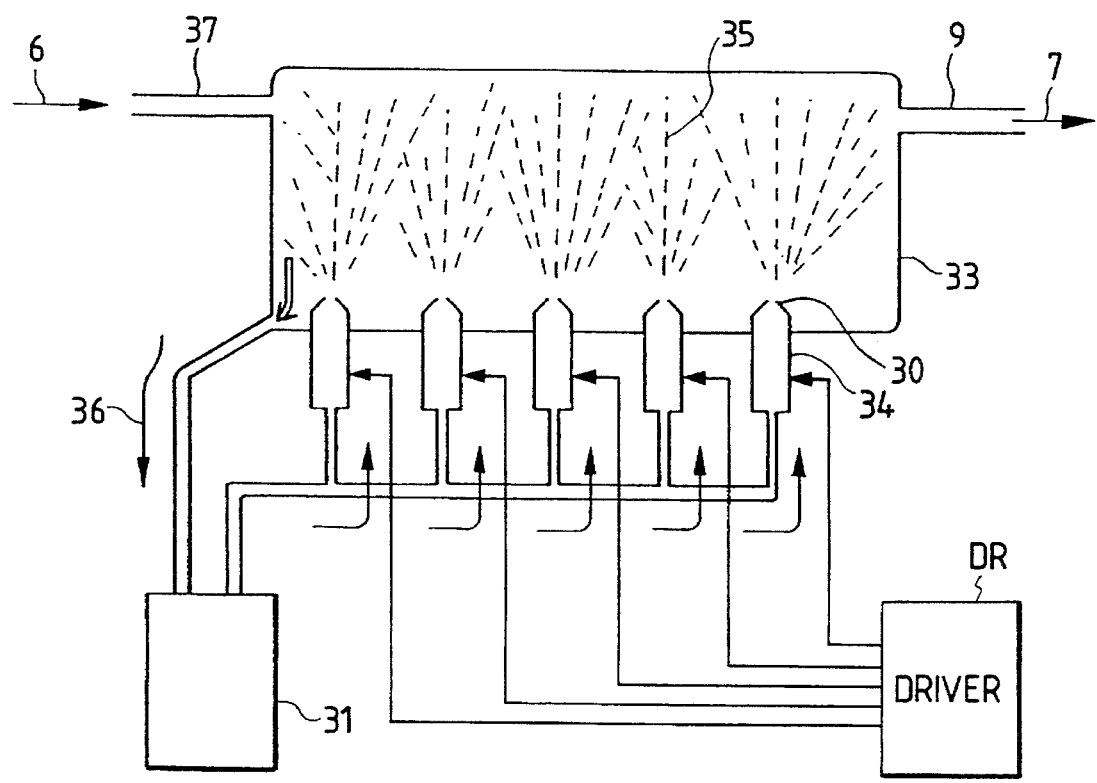
FIG. 4 is a schematic diagram illustrating a still another example of the gas-feeding device of the present invention.

A still another example of the constitution of the gas-feeding device of the present invention is illustrated in FIG. 4.

An organometallic compound is stored in a liquid state in a metallic container 31. A gas is introduced through nozzles 30. Atomizers 34 (piezoelectric atomizers) employing a piezoelectric element as an ejection-energy-generating means spray the organometallic compound drawn up from the metallic container 31 in a mist state into a metallic chamber 33. The piezoelectric atomizer 34 is preferably provided in plural numbers. Five atomizers are provided in the example in FIG. 4. The atomizers 34 are connected to a driving circuit (DR) for supplying a driving signal to be controlled by the driving circuit. In this example, the piezoelectric atomizers 34 serve as a gas-generation-accelerating means for generating the starting gas effectively.

The organometallic compound is ejected in a size of several μm or less in a mist state from the piezoelectric atomizers 34. Although the atomizers 34 are installed at the bottom of the metallic chamber 33 in the figure, they may be installed at the side face of the chamber. An atomizer other than the piezoelectric type may also be used.

The inside wall of the metallic chamber 33 is preferably coated with an insulating material such as $SiO_2$ or the like because an organometallic compound such as TMA and DMAH will decompose at a metal surface of SUS in the presence of hydrogen, even at room temperature, to form an unnecessary alkane such as methane and the like.

In such a device, a carrier gas 6 such as hydrogen, argon, nitrogen, and the like is introduced through an inlet pipe 37. The carrier gas comes to contain the organometallic compound in an amount corresponding to the saturated vapor pressure while passing through the metallic chamber where the organometallic compound is sprayed in a mist state, and flows out from an outlet pipe 9 as a starting gas 7. The organometallic compound is in a mist state, having a size of several μm or less, and is contained in the carrier gas effectively.

The organometallic compound that has attached itself to the inside face of the metallic chamber 33 is recovered through a recovery pipe 36 to the metallic container 31 containing the organometallic compound.

The use of a piezoelectric atomizer allows spraying in a mist state even if the organometallic compound has a high viscosity, so that the organometallic compound can be contained in a carrier gas effectively and independently of the viscosity of the organometallic compound. Since the carrier gas does not pass through a liquid, there is no fluctuation of the flow rate of the carrier gas 7 containing the organometallic compound. Thus pulsation of the flow can be completely prevented instead of being caused in the transportation of an organometallic compound of high viscosity. By the method of transporting an organometallic compound of this constitution, the transportation of DMAH can be effected in the state that the carrier gas contains DMAH in an amount corresponding to the saturated vapor pressure thereof, even if the total flow Pate of the carrier gas is as much as 10 slm (standard liter per minute).

No method has hitherto been found for transporting effectively an organometallic compound by such a large amount of carrier gas. In particular, in the conventional vacuum CVD method employing DMAH, the number of wafers usable in one deposition batch depends on the efficiency of transportation of a large amount of viscous DMAH. The use of the gas-feeding device of the present invention in a deposition-film-forming apparatus, shown later in FIG. 6, makes feasible the deposition of an Al or Al—Si thin film on 100–200 wafers of 4 inches in one deposition batch at a high deposition rate.

The gas-feeding device shown in the example transports an organometallic compound in a liquid state from a container storing the organometallic compound, and ejects the liquid organometallic compound in a mist through an ejection means like a piezoelectric nozzle into a space, thereby discharging 10 an introduced gas which contains the organometallic compound in an amount corresponding to the saturated vapor pressure thereof.

The gas-feeding device described above is suitably used with a deposition-film-forming apparatus described below.

Figure 6:
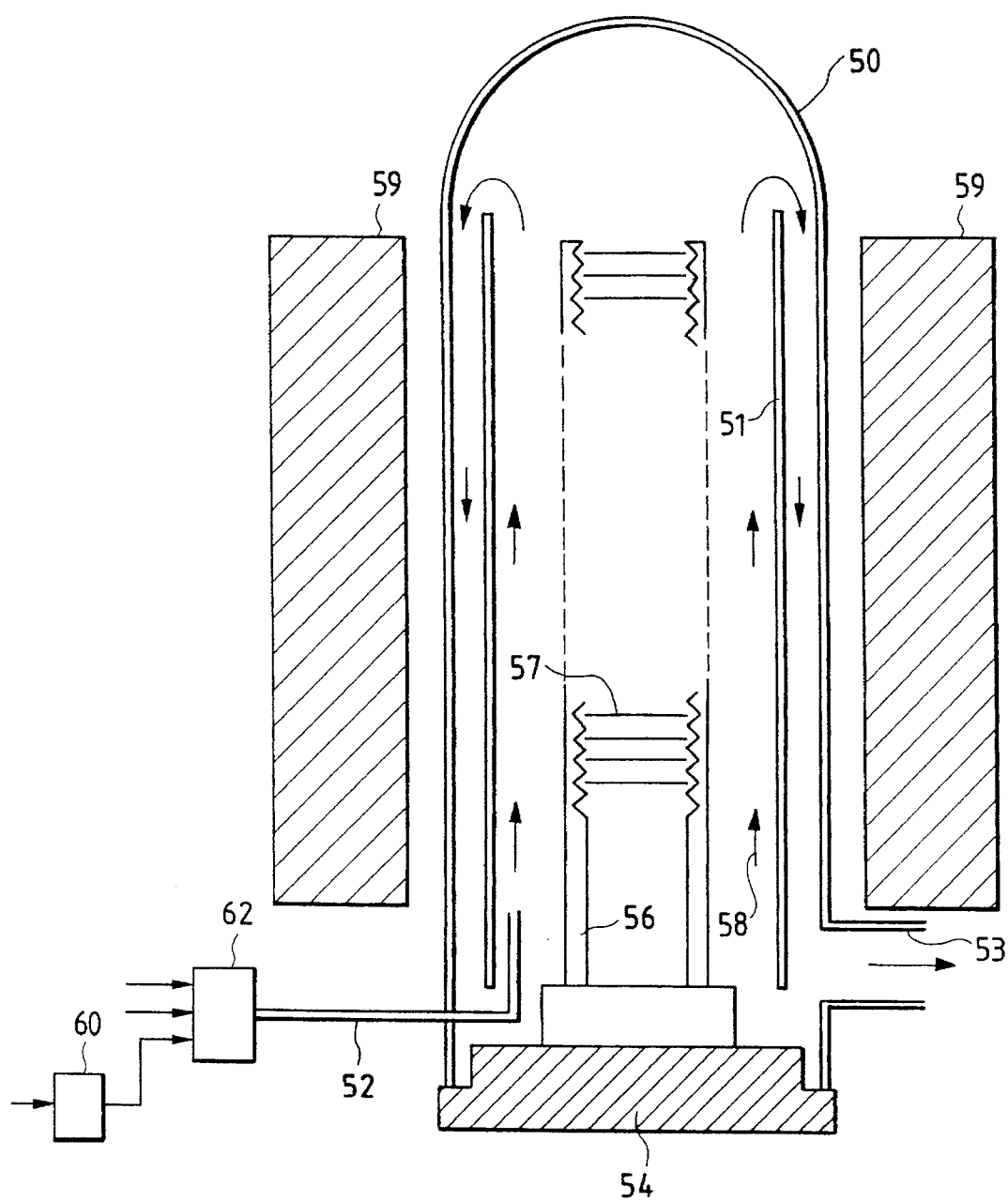
FIG. 6 is a schematic diagram of a deposition-film-forming apparatus to which the gas-feeding device of the present invention is applicable.
Figure 7:
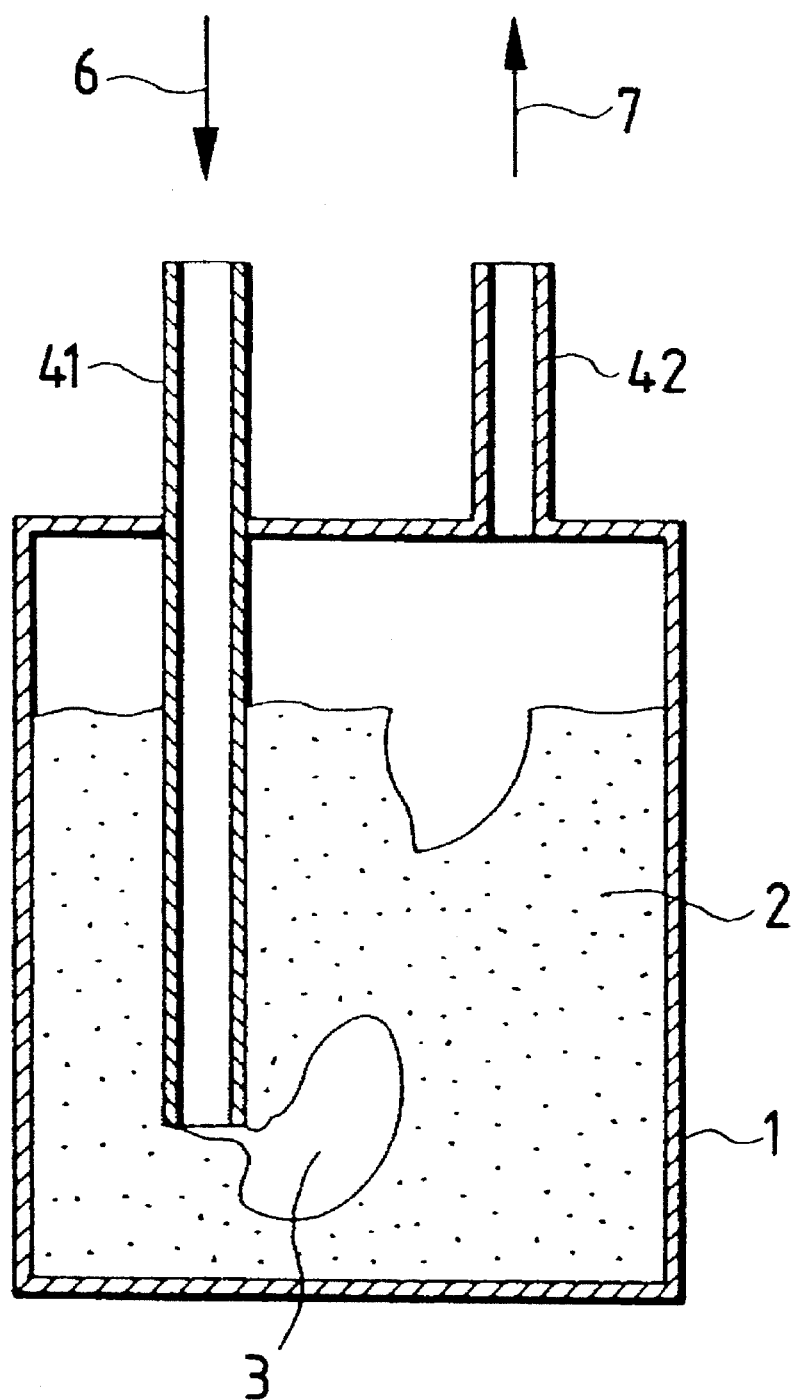
FIG. 7 is a schematic diagram of a conventional gas-feeding apparatus.

FIG. 6 illustrates a schematic sectional view of a deposition-film-forming apparatus of the present invention.

An external reaction tube 50 made of quartz forms a substantially enclosed space for deposition film formation. In the interior, a plurality of substrates 57 for formation of a metal film mainly constituted of aluminum, silicon or the like as the deposition film are fixed by a substrate holder 56 at a predetermined position. An internal reaction tube 51 made of quartz separates the gas flow in the external reaction tube 50. A metallic flange 54 closes or opens an opening of the external reaction tube 50. The substrates 57 are placed in the substrate holder 56 arranged in the interior reaction tube 51. The substrate holder 56 is preferably made of quartz.

In this apparatus, the temperature of the substrates is controlled by e heater 59. The pressure in the reaction tube 50 is controlled by an exhausting system connected through a gas exhausting outlet 53.

The apparatus shown by FIG. 6 has a mixer 62 which is connected with a first gas system for a gas fed from a gas-feeding device, and a second gas system for $H_2$ or the like, and further a third gas system for $Si_2H_6$ or the like, from which the resulting starting gas mixture is introduced through a starting-gas-introducing pipe 52 into the reaction tube 50. The starting gas reacts at the surface of the substrates 57 while passing through the inside of the interior reaction tube 51 as shown by arrow marks 58 in FIG. 6, resulting in deposition of Al or A—Si on the substrate surface. The gas after the reaction passes through a space formed by the internal reaction tube 51 and the external reaction tube 50 and is exhausted from an exhausting outlet 53.

To take in or out the substrates, the metallic flange 54 is lowered together with the substrate holder 56 and the substrates 57 by means of an elevator (not shown in the figure) to move it to a predetermined position.

With such an apparatus under the aforementioned deposition-film-forming conditions, satisfactory Al or Al—Si film can be formed simultaneously on all wafers in the apparatus.

As described above, the gas-feeding device of the present invention is particularly suitable for apparatuses for forming deposition films by use of an organometallic compound having a high viscosity like DMAH in a large amount. Naturally, the kind of the organometallic compounds, the constitution of the deposition-film-forming apparatuses or the like matters are not limited to the above examples.

According to the present invention, excellent deposition films can be formed in a large quantity at a high production rate since the present inventions enables the stable transportation of a large amount of starting gas without problems such as size increase of the apparatus even when an organometallic compound having a high viscosity is employed. Thus the production cost of the semiconductor device can be reduced remarkably.

Specifically, the gas-feeding device illustrated in FIG. 1 is suitably applied to an apparatus for the vacuum CVD method illustrated, for example, in FIG. 6 which is capable of holding a large number of wafers (substrates) at a time and depositing Al or Al—Si. Since the deposition of Al or Al—Si undergoes by a surface reaction at a heated electron-donating substrate surface, Al or Al—Si can be deposited from DMAH and $H_2$ (or further with an Si starting gas such as $Si_2H_6$) by a hot wall type of the vacuum CVD method in which the substrate only is heated.

In the film formation, Al or Al—Si deposits to a thickness of 100–200 Å only on an electron-donating substrate under conditions of a reaction tube pressure of from $10^{-3}$ to 760 Torr, a substrate temperature of from 270° to 350° C., DMAH partial pressure of from $1\times10^{-5}$ to $1.3\times10^{-3}$ times the reaction tube pressure, (or further $Si_2H_6$ partial pressure of from $1\times10^{-7}$ to $1\times10^{-4}$ times the reaction tube pressure). For improvement of film thickness uniformity in wafers, the reaction tube pressure is preferably from $5\times10^{-2}$ to 5 Torr, and the DMAH partial pressure is preferably from $1.3\times10^{-5}$ to $1.3\times10^{-4}$ times the reaction tube pressure. The preferable substrate temperature is from 270° to 300° C. for suppressing surface migration and preparing satisfactory continuous film.

Further, the gas-feeding device illustrated in FIG. 3 is also suitably applied to an apparatus for the vacuum CVD method illustrated, for example, in FIG. 6 which is capable of holding a large number of wafers (substrates) at a time and depositing Al or Al—Si. Since the deposition of Al or Al—Si undergoes by a surface reaction at a heated electron-donating substrate surface, Al or Al—Si can be deposited from DMAH and $H_2$ (or further with an Si starting gas such as $Si_2H_6$) by a hot wall type vacuum CVD method in which only the substrate is heated.

In the film formation, Al or Al—Si deposits to a thickness of 100–200 Å only on an electrondonating substrate under conditions of a reaction tube pressure of from $10^{-3}$ to 760 Torr, a substrate temperature of from 250° to 350° C., DMAH partial pressure of from $1\times10^{-5}$ to $1.3\times10^{-3}$ times the reaction tube pressure, (or further $Si_2H_6$ partial pressure of from $1\times10^{-7}$ to $1\times10^{-4}$ times the reaction tube pressure). For improvement of film thickness uniformity in wafers, the reaction tube pressure is preferably from $5\times10^{-2}$ to 5 Torr, and the DMAH partial pressure is preferably from $1.3\times10^{-5}$ to $1.3\times10^{-4}$ times the reaction tube pressure. The preferable substrate temperature is from 270° to 300° C. for suppressing surface migration and preparing satisfactory continuous film.

Still further, the gas-feeding device illustrated in FIG. 4 is also suitably applied to an apparatus for the vacuum CVD method illustrated, for example, in FIG. 6 which is capable of holding a large number of wafers (substrates) at a time and depositing Al or Al—Si. Since the deposition of Al or Al—Si undergoes by a surface reaction at a heated electron-donating substrate surface, Al or Al—Si can be deposited from DMAH and $H_2$ (or further with an Si starting gas such as $Si_2H_6$) by a hot wall type of the vacuum CVD method in which the substrate only is heated.

In the film formation, Al or Al—Si deposits to a thickness of 100–200 Å only on an electron-donating substrate under conditions of the reaction tube pressure of from $10^{-3}$ to 760 Torr, the substrate temperature of from 250° to 350° C., DMAH partial pressure of from $1\times10^{-5}$ to $1.3\times10^{-3}$ time the reaction tube pressure, (or further $Si_2H_6$ partial pressure of from $1\times10^{-7}$ to $1\times10^{-4}$ times the reaction tube pressure). For improvement of film thickness uniformity, the reaction tube pressure is preferably from $5\times10^{-2}$ to 5 Torr, and the DMAH partial pressure is preferably from $1.3\times10^{-5}$ to $1.3\times10^{-4}$ times the reaction tube pressure. The preferable substrate temperature is from 270° to 300° C. for suppressing surface migration and preparing satisfactory and continuous film.

The method for deposition film formation, namely, the CVD method utilizing an alkylaluminum hydride, particularly an alkylaluminum hydride having a methyl group is described in detail.

In this method, a gas containing an organometallic compound, specifically dimethylaluminum hydride (DMAH):

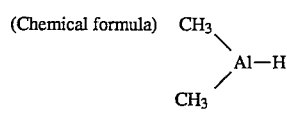

(Chemical formula)

or monomethylaluminum hydride (MMAH$_2$)

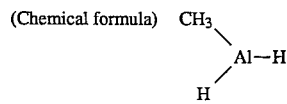

(Chemical formula)

is used as a starting gas containing at least one atom to be a constitutional element of the deposition film, or further a gas containing a Si atom as a starting gas, or further additionally hydrogen as the starting gas are used. An Al or Al—Si film is formed selectively on the substrate by vapor deposition.

The substrate applicable to this method has a first substrate surface material for providing a surface for deposition of Al or Al—Si, and a second substrate surface material for non-deposition of Al or Al—Si. The first substrate surface material is composed of an electron-donating substance.

The electron-donating property is explained in detail.

An electron-donating material is such a material that free electrons exist or a free electron is intentionally formed in the substrate: for example, where a material having a surface on which a chemical reaction is accelerated by electron transfer with a starting gas molecule adhering on the substrate surface. Generally, metals and semiconductors are the examples. Metals and semiconductors having extremely thin oxide film on the surface are included thereto, since the electron transfer between the substrate and the adhered starting molecule occurs to cause the chemical reaction if the oxide film is extremely thin.

Specific examples thereof are semiconductors such as single crystalline silicon, polycrystalline silicon, amorphous silicon and the like; III–V group compound semiconductor and II–VI group compound semiconductor composed of binary, ternary or quaternary combinations of Ga, In, and Al as the Group III element and P, As, and N as the group V element; metals per se such as tungsten, molybdenum, tantalum, aluminum, titanium, copper, and the like; silicides of the above metals such as tungsten silicide, molybdenum silicide, tantalum silicide, aluminum silicide, titanium silicide, and the like; and metals containing any one of the above metal such as aluminum silicon, aluminum titanium, aluminum copper, aluminum tantalum, aluminum silicon copper, aluminum silicon titanium, aluminum palladium, titanium nitride, and the like.

On the other hand, the materials having a surface on which Al or Al—Si does not selectively deposit, namely non-electron-donating materials include usual insulating materials; silicon oxide formed by thermal oxidation, CVD, etc.; glass or oxide films such as BSG, PSG, BPSG, and the like; prepared by the thermal CVD, plasma CVD, vacuum CVD, ECR-CVD methods; and the like materials.

On the substrate of such constitution, Al or Al—Si deposits by only a simple thermal reaction in a reaction system of a starting gas and hydrogen. For example, the thermal reaction in the reaction system of DMAH and hydrogen is considered basically as below:

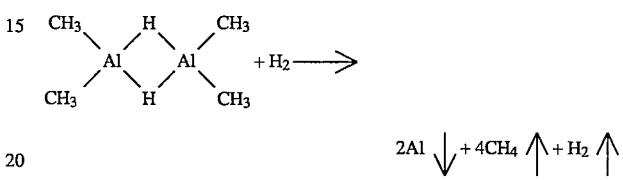

The DMAH has a dimer structure at a room temperature. The addition of $Si_2H_6$ or the like causes formation of Al—Si alloy because the $Si_2H_6$ having reached to the substrate surface decomposes by a surface chemical reaction and the resulting Si is incorporated into the film. From MMAH$_2$ also, high quality Al could be deposited. However, MMAH$_2$, which has a vapor pressure as low as 0.01 to 0.1 Torr, cannot readily be transported in a large amount, thereby the upper limit of the deposition rate being several hundred Å/min or below. Therefore DMAH, which has a vapor pressure of 1 Torr at room temperature, can preferably be used.

The aluminum film prepared by the above method assumes a single crystal structure, excellent in surface smoothness, anti-migration characteristics, etc., having low resistance and superior characteristics for wiring and use of electrodes.

In the deposition of an aluminum film from an alkylaluminum hydride, the temperature of the substrate is selected within the range of from the decomposition temperature of alkylaluminum hydride to be used to 450° C., more preferably from 200° to 350° C., still more preferably from 270° C. to 350° C.

The mechanism of aluminum deposition is considered as described below referring FIG. 5 at the moment.

Figure 5A:
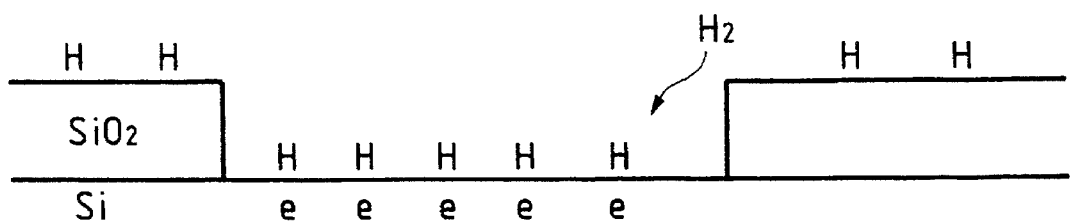
FIGS. 5A, 5B, 5C and 5D are schematic diagrams for explaining the mechanism of preferable selective formation of the deposition film by using the gas-feeding device of the present invention.
Figure 5B:
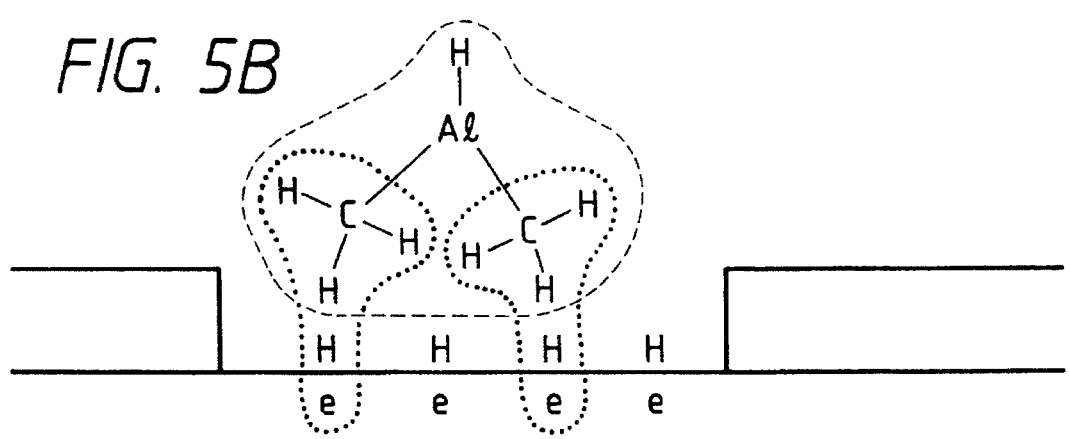
Figure 5C:
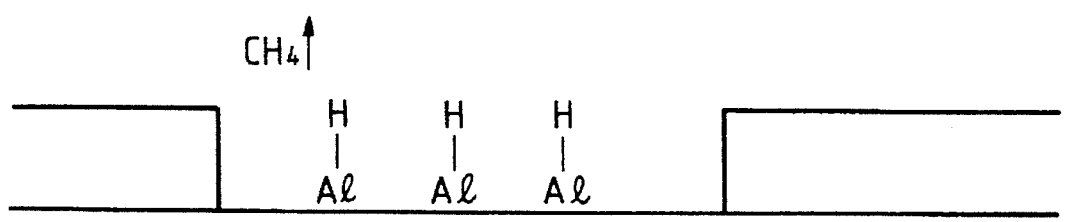

When DMAH reaches, with its methyl group directed to the substrate sides, a substrate in a state that hydrogen atoms are attached on an electron-donating substrate, namely on a substrate having electrons (FIG. 5A), the electron on the substrate cuts a bond between aluminum and a methyl group (FIGS. 5B and 5C). The reaction is as below.

$(CH_3)_2AlH+2H+2e \rightarrow 2CH_4\uparrow+Al—H$

Figure 5D:
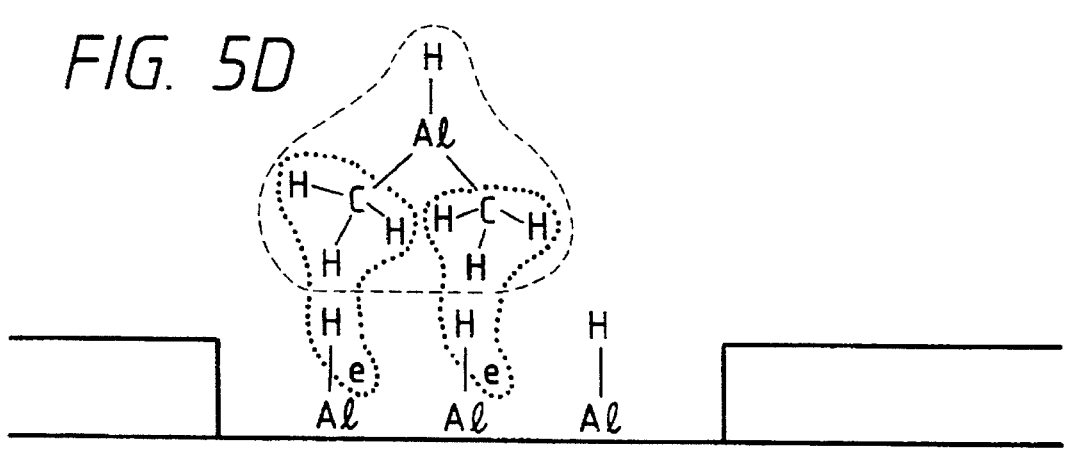

The similar reaction proceeds with hydrogen remaining on aluminum that has deposited and free electrons (FIG. 5D). If hydrogen atoms are deficient, then, a hydrogen molecule, being the starting gas, decomposes to supply hydrogen atoms. On the contrary, on a non-electron-donating surface, the above reaction does not proceed owing to lack of electrons, causing no deposition of aluminum. Incidentally, FIGS. 5A to 5D are to aid understanding of the reaction mechanism, so that the numbers of H, e and Al are not consistent Examples of an experiment regarding gas transportation by using a gas-feeding device of the present invention are described below.

Experimental Example 1

Into an organometallic compound contained in the metallic container 10 of FIG. 1, hydrogen gas was introduced through the metallic pipe 4 at a flow rate of L sccm. By utilizing the gas switch 19, hydrogen gas was fed to each of the pipes 11–17 at a flow rate of (L/6) sccm in pulse at a timing shown in FIG. 2. Into each pipe, the gas was fed for a time of $T_1$ and the gas was stopped for a time of $T_2$. The partial pressure of DMAH was measured in the gas 7 flowing out from the outlet pipe 5 at varied $T_1$ and $T_2$.

As shown in Table 1, even at the flow rate of hydrogen gas of 600 sccm, the DMAH was contained at a partial pressure of 1 Torr in the outgoing hydrogen gas, which is equal to the saturated vapor pressure at room temperature. The variation of flow rate of the outgoing hydrogen gas was within 1%.

TABLE 1

| L (sccm) | 100 | 100 | 300 | 300 | 600 | 600 | 800 | 800 |
|---|---|---|---|---|---|---|---|---|
| $T_1$ (sec) | 30 | 60 | 30 | 60 | 30 | 60 | 30 | 60 |
| $T_2$ (sec) | 5 | 10 | 5 | 10 | 5 | 10 | 5 | 10 |
| DMAH partial pressure (Torr) | 1 | 1 | 1 | 1 | 1 | 1 | 0.8 | 0.8 |

Experimental Example 2

Measurements were made in the same manner as in Experimental example 1 except that argon gas was used in place of hydrogen. The results were similar to those in Table 1. Even at the flow rate of 600 sccm, the DMAH was transported with the outgoing argon gas at a partial pressure equal to its saturated vapor pressure.

Experimental Example 3

In FIG. 1, a metal pipe having five small openings was used as the tip of the respective pipes 11–17. Into an organometallic compound contained in the metallic container 10, hydrogen gas was introduced through a metallic pipe 4 at a flow rate of L sccm. By utilizing the gas switch 19, hydrogen gas was fed to each of the pipes 11–17 at a flow rate of (L/6) sccm in pulse at a timing shown in FIG. 2. Into each pipe, the gas was fed for time $T_1$ and the gas was stopped for time $T_2$. The partial pressure of DMAH was measured in the gas 7 flowing out from the outlet pipe 5 at varied $T_1$ and $T_2$.

As shown in Table 2, even at the flow rate of hydrogen gas of 3000 sccm, the DMAH was contained at a partial pressure of 1 Torr in the outgoing hydrogen gas, which is equal to the saturated vapor pressure at room temperature. The variation of flow rate of the outgoing hydrogen gas was within 1%.

The carrier gas may be an inert gas, nitrogen gas, hydrogen gas, etc. For aluminum deposition, hydrogen gas is especially preferable since hydrogen atoms affect directly the aluminum deposition.

TABLE 2

| L (sccm) | 300 | 300 | 900 | 900 | 3000 | 3000 | 4000 | 4000 |
|---|---|---|---|---|---|---|---|---|
| $T_1$ (sec) | 30 | 60 | 30 | 60 | 30 | 60 | 30 | 60 |
| $T_2$ (sec) | 5 | 10 | 5 | 10 | 5 | 10 | 5 | 10 |
| DMAH partial pressure (Torr) | 1 | 1 | 1 | 1 | 1 | 1 | 0.8 | 0.8 |

Experimental Example 4

A gas-feeding device illustrated in FIG. 3 was employed. In the device, the metal pipe 4 inserted in the organometallic compound had 100 small openings 5. Hydrogen gas 6 is introduced through the metal pipe 4 at a flow rate of L slm. The DMAH partial pressure contained in the hydrogen gas 7 flowing out from the outlet pipe 5 was measured.

As shown in Table 3, even at the flow rate of hydrogen gas of 10 slm, the DMAH was contained at a partial pressure of 1 Torr in the outgoing hydrogen gas, which is equal to the saturated vapor pressure at room temperature. The variation of flow rate of the outgoing hydrogen gas was within 1%.

TABLE 3

| L (slm) | 0.5 | 1.5 | 5.0 | 10.0 | 12.0 |
|---|---|---|---|---|---|
| DMAH partial pressure (Torr) | 1 | 1 | 1 | 1 | 0.8 |

Experimental Example 5

Measurements were made in the same manner as in Experimental example 4 except that argon gas was used in place of hydrogen. The results were similar to those in Table 3. Even at the flow rate of 10 slm, the DMAH was transported with the outgoing argon gas at a partial pressure equal to its saturated vapor pressure.

The gas-feeding device employed in this experimental example was found to be preferably applicable to a deposition-film-forming apparatus of vacuum CVD for selective deposition of an Al or Al—Si film of superior quality on a substrate as an electroconductive deposition film in the same way as the gas-feeding device employed in Experimental example 1.

Experimental Example 6

A device illustrated in FIG. 4, in which five piezoelectric atomizers 34 were installed, was used for transporting an organometallic compound, DMAH. Hydrogen gas 6 is introduced through the metal pipe 37 at a flow rate of L slm. The DMAH partial pressure of the hydrogen gas was measured flowing out from the outlet pipe 9.

As shown in Table 4, even at the flow rate of hydrogen gas of 10 slm, the DMAH was contained at a partial pressure of 1 Torr in the flowing-out hydrogen gas, which is equal to the saturated vapor pressure at room temperature. The variation of flow rate of the outgoing hydrogen gas was within 1%.

TABLE 4

| L (slm) | 0.5 | 1.5 | 5.0 | 10.0 | 12.0 |
|---|---|---|---|---|---|
| DMAH partial pressure (Torr) | 1 | 1 | 1 | 1 | 0.8 |

Experimental Example 7

Measurements were made in the same manner as in Experimental example 6 except that argon gas was used in place of hydrogen. The results were similar to those in Table 4. Even at the flow rate of 10 slm, the DMAH was transported with the outgoing argon gas at a partial pressure equal to its saturated vapor pressure.

The gas-feeding device employed in this experimental example was found to be preferably applicable to a deposition-film-forming apparatus of vacuum CVD for selective deposition of an Al or Al—Si film of superior quality on a substrate as an electroconductive deposition film in the same way as the gas-feeding device employed in Experimental examples 1–5.

What is claimed is:

1. A gas-feeding device for feeding a starting gas for deposition-film-formation by a chemical vapor deposition method, said device comprising:

a container for containing an organometallic compound and having a space for forming an atmosphere of a starting gas comprising the organometallic compound;

gas-introducing means connected to said container and having a plurality of gas-introducing openings for introducing a carrier gas into said container to vaporize the organometallic compound, thereby producing the starting gas; and accelerating-means, which selects a carrier gas introducing route into said container through at least one of the plurality of gas-introducing openings, for accelerating the generation of the starting gas.

2. The gas-feeding device of claim 1, wherein said accelerating means comprises gas-switching means which turns on or turns off feed lines of the carrier gas respectively connected to each of the plurality of gas-introducing openings for distributing the carrier gas through a turned-on feed line to its respective one of the plurality of gas-introducing openings.

3. A gas-feeding device for feeding a starting gas for deposition-film-formation by a chemical vapor deposition method, said device comprising:

organometallic compound-storing means for forming an atmosphere of a starting gas comprising an organometallic compound;

a plurality of gas-introducing members for introducing a carrier gas into said storing means; and gas switching means for turning on or turning off feed lines that are capable of distributing the carrier gas and that are respectively connected to each of said plurality of gas-introducing members, and for causing the distribution of the carrier gas to said storing means through at least one turned-on feed line.

4. The gas-feeding device of claim 3, wherein the feed lines that distribute the carrier gas to the plurality of gas-introducing members are turned on or turned off with selective timing delays.

5. The gas-feeding device of claim 3, wherein each of said plurality of gas-introducing members comprises a plurality of gas-introducing openings for introducing the carrier gas into the organometallic compound.

6. A deposition-film-forming apparatus for using a chemical vapor deposition method, said apparatus comprising:

(1) a gas-feeding device for feeding a starting gas, said device comprising:

a container for containing an organometallic compound and having a space for forming an atmosphere of the starting gas, which comprises the organometallic compound, for formation of a deposition film;

gas-introducing means connected to said container and having a plurality of gas-introducing openings for introducing a carrier gas into said container to vaporize the organometallic compound thereby producing the starting gas; and accelerating means, which selects a carrier gas introducing route into said container through at least one of the plurality of gas-introducing openings, for accelerating the generation of the starting gas;

(2) a reaction chamber connected to said gas-feeding device for receiving the starting gas; and (3) exhausting means connected to said reaction chamber for exhausting the starting gas from said reaction chamber.

7. The gas-feeding device of claim 6, wherein said accelerating means comprises gas-switching means which turns on or turns off feed lines of the carrier gas respectively connected to each of the plurality of gas-introducing openings for distributing the carrier gas through a turned-on feed line to its respective one of the plurality of gas-introducing openings.

8. A deposition-film-forming apparatus for using a chemical vapor deposition method, said apparatus comprising:

(1) a gas-feeding device for feeding a starting gas, said device comprising:

organometallic compound-storing means for forming an atmosphere of the starting gas, which comprises an organometallic compound, for deposition film formation;

a plurality of gas-introducing members for introducing a carrier gas into said storing means; and gas switching means for turning on or turning off feed lines that are respectively connected to and capable of distributing the carrier gas to each of said plurality of gas-introducing members and for distributing the carrier gas to said storing means through at least one turned-on feed line;

(2) a reaction chamber connected to said gas-feeding device for receiving the starting gas; and (3) exhausting means connected to said reaction chamber for exhausting the starting gas from said reaction chamber.

* * * * *